(12) United States Patent
Cho

(10) Patent No.: US 7,548,475 B2
(45) Date of Patent: Jun. 16, 2009

(54) APPARATUS OF PROCESSING A SIGNAL IN A MEMORY DEVICE AND A CIRCUIT OF REMOVING NOISE IN THE SAME

(75) Inventor: Yong Deok Cho, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/771,998

(22) Filed: Jun. 29, 2007

(65) Prior Publication Data
US 2008/0239850 A1    Oct. 2, 2008

(30) Foreign Application Priority Data
Mar. 29, 2007    (KR) ............... 10-2007-0030738

(51) Int. Cl.
*G11C 7/00* (2006.01)
*G11C 7/02* (2006.01)
*H03B 1/10* (2006.01)
(52) U.S. Cl. .................. 365/206; 365/194; 327/551
(58) Field of Classification Search .............. 365/206
See application file for complete search history.

(56) References Cited

U.S. PATENT DOCUMENTS

| 5,440,511 | A | * | 8/1995 | Yamamoto et al. ..... 365/189.05 |
| 5,748,034 | A | * | 5/1998 | Ketineni et al. ............. 327/551 |
| 5,883,847 | A | * | 3/1999 | Takahashi ................... 365/208 |
| 6,058,070 | A | * | 5/2000 | La Rosa .................. 365/233.5 |
| 6,603,684 | B2 | * | 8/2003 | Im ........................ 365/189.05 |
| 6,639,870 | B2 | * | 10/2003 | Sin ......................... 365/233.5 |
| 6,717,868 | B2 | * | 4/2004 | Kato et al. ................... 365/194 |
| 6,809,989 | B2 | * | 10/2004 | Takahashi et al. ....... 365/230.08 |
| 6,894,540 | B1 | * | 5/2005 | Ali et al. ........................ 327/34 |
| 2003/0112668 | A1 | * | 6/2003 | Takahashi et al. ........... 365/200 |
| 2005/0206427 | A1 | * | 9/2005 | Yuasa et al. ................. 327/262 |

FOREIGN PATENT DOCUMENTS

| JP | 2000-195285 | 7/2000 |
| KR | 100237031 B1 | 10/1999 |
| KR | 10-2005-0011984 A | 1/2005 |

* cited by examiner

*Primary Examiner*—Son L Mai
(74) *Attorney, Agent, or Firm*—Townsend and Townsend and Crew LLP

(57) ABSTRACT

A circuit for removing noise from an input signal includes a falling edge signal delaying circuit configured to output a first delay output signal generated by delaying a falling edge of a first output signal for a preset time; a falling edge sensing circuit configured to sense the falling edge of the first output signal, and generate a pulse signal in accordance with the sense; a flip-flop configured to output the first delay output signal in accordance with an input clock signal; and a first logic operation circuit configured to perform a logic operation on an output signal of the flip-flop and the first output signal delayed for the preset time, thereby generating a second output signal.

20 Claims, 6 Drawing Sheets

APPARATUS OF PROCESSING A SIGNAL IN A MEMORY DEVICE AND A CIRCUIT OF REMOVING NOISE IN THE SAME

CROSS-REFERENCE TO RELATED APPLICATIONS

This application claims priority to Korean Patent Application No. 2007-30738, filed on Mar. 29, 2007, the contents of which are incorporated herein by reference in its entirety.

BACKGROUND OF THE INVENTION

The present invention relates to a circuit for removing noise in a data input operation of a memory device. More particularly, the present invention relates to an apparatus for processing a signal in a memory device and a circuit for removing noise such as a glitch or notch occurring in a data input signal.

A NAND flash memory device includes a memory cell array, a row decoder and a page buffer.

The memory cell array has a plurality of word lines extending in rows, a plurality of bit lines extending in columns, and cell strings corresponding to the bit lines.

A column decoder connected to a string select line, the word lines and a common source line is disposed at one side of the memory cell array. The page buffer connected to the bit lines is located at another side of the memory cell array.

A chip is formed by packaging the flash memory device with surrounding circuits that are needed for operation of the flash memory device. Data, an operation command and power, etc., are input through pads connected to a connection pin of the chip.

FIG. 1 is a block diagram illustrating a partial data signal input circuit included in a conventional flash memory device. The data signal input circuit processes a write enable WE signal for inputting data to the flash memory device.

In FIG. 1, the data signal input circuit 100 includes a WE pad 110 for receiving the WE signal for inputting data, an input buffering section 120 for buffering the WE signal provided from the WE pad 110 and outputting a digital signal WESYNC_N, a clock generator 130 for outputting an address counter synchronizing signal CK4CNT (Clock for Count) and a command interface synchronizing signal CK4CI (Clock for Command interface) in accordance with the signal WESYNC_N output from the input buffering section 120, an address counter 140 for receiving the synchronizing signal CK4CNT from the clock generator 130 and counting an address using the received synchronizing signal CK4CNT, and a command interface section 150 for receiving the synchronizing signal CK4CI from the clock generator 130 and providing an interface for performing a command.

The WE pad section 110 is connected to the connection pin of the chip for receiving the WE signal, and transmits the received WE signal to the input buffering section 120.

The input buffering section 120 buffers the WE signal transmitted from the WE pad section 120, and amplifies the buffered WE signal to a digital level, and outputs the amplified WE signal, i.e. signal WESYNC_N.

The clock generator 130 receives the signal WESYNC_N from the input buffering section 120, and outputs the signals CK4CNT and CK4CI using the received signal WESYNC_N.

The address counter 140 and the command interface section 150 output a control signal for controlling an data input operation so that input data is synchronized with a clock in accordance with the signals CK4CNT and CK4CI.

In the data signal input circuit 100, noise may occur in the WE signal input through the WE pad 110 due to, for example, outside interference.

FIG. 2A is a timing diagram illustrating an output signal of the input buffering section when a notch occurs in the WE signal of FIG. 1.

Referring to FIG. 1 and FIG. 2A, the notch may occur in the WE signal input through the WE pad section 110.

The notch 210 is referred to as a ring back phenomenon, and may occur for any of various reasons.

The input buffering section 120 amplifies the input WE signal to a digital level, and outputs the amplified WE signal. Particularly, as shown in FIG. 2A, the input buffering section 120 generally outputs the signal WESYNC_N having a high level when the WE signal has a voltage greater than an upper voltage VIH, and outputs the signal VESYNC_N having a low level when the WE signal has a voltage less than a lower voltage VIL.

Accordingly, a level of the WE signal to which the notch phenomenon occurs as shown in FIG. 2A is converted to a high level when the WE signal is increased to a voltage more than the upper voltage VIH, and is converted to a low level when the WE signal is decreased to a voltage less than the lower voltage VIL.

The level of the WE signal in FIG. 2A is converted from a high level to a low level and then converted from a low level to a high level to enable data input.

The notch occurs to the WE signal when the WE signal is converted from a high level to a low level and when the WE signal is converted from a low level to a high level. As a result, the input buffering section 120 outputs the signal WESYNC_N as shown in FIG. 2A.

However, the level of the normal WE signal should be converted from a high level to a low level for a certain time, and then converted from a low level to a high level.

FIG. 2B is a timing diagram illustrating the output signal of the input buffering section when a glitch phenomenon occurs to the WE signal of FIG. 1.

In FIG. 1 and FIG. 2B, the glitch phenomenon may occur to the WE signal input through the WE pad section 110.

The WE signal which should be maintained at a high level is instantaneously decreased to a voltage less than the lower voltage VIL and is then increased to a voltage greater than the lower voltage VIL due to the glitch phenomenon 220.

As a result, the input buffering section 120 outputs the signal WESYNC_N which is decreased from a high level to a low level and is then increased to a high level. However, a level of the normal signal WESYNC_N is constantly maintained at a high level.

The notch phenomenon or the glitch phenomenon is noise generated when impedance mismatching of a channel or a power drop occurs on a printed circuit board (PCB) packaged in the chip.

When the notch phenomenon or the glitch phenomenon occurs to the WE signal, as shown in FIG. 2A and FIG. 2B, the input buffering section 120 outputs a signal different from the normal signal WESYNC_N. Since the notch phenomenon or the glitch phenomenon causes a malfunction of the chip, it is important to remove the noise such as caused by the notch and the glitch.

SUMMARY OF THE INVENTION

It is a feature of the present invention to provide an apparatus for processing a signal in a memory device and a circuit for removing noise occurring to an input signal of a memory chip so that the memory chip is operates normally in accordance with the input signal.

An apparatus for processing a signal in a memory device according to one example embodiment of the present invention includes an input buffering section configured to amplify an input control signal to a digital level, and output a first output signal in accordance with the amplification; a noise sense removing circuit configured to sense a notch phenomenon or a glitch phenomenon occurring to the first output signal, remove the notch phenomenon or the glitch phenomenon, and output a second output signal in accordance with the removal; and a clock generator configured to generate a clock signal using the second output signal.

The noise sense removing circuit includes a falling edge signal delaying circuit configured to delay a falling edge of the first output signal for a preset time, thereby outputting a first delay output signal; a falling edge sensing circuit configured to generate a pulse signal by sensing the falling edge of the first output signal; a flip-flop configured to output the first delay output signal in accordance with the clock signal, and operate using an output signal of the falling edge sensing circuit as a reset signal; and a first logic operation circuit configured to perform a logic operation on an output signal of the flip-flop and the first output signal delayed for the preset time, thereby generating the second output signal.

The falling edge signal delaying circuit includes a falling edge delaying circuit configured to delay the falling edge of the first output signal for a first predetermined time; and a first signal delaying circuit configured to delay for a second preset time a signal generated by inverting after performing a logic operation on an output signal of the falling edge delaying circuit and the first output signal, and output the first delay output signal in accordance with the delay. In one aspect, the logic operation is a NOR operation.

The falling edge sensing circuit includes an inverted signal delaying circuit configured to invert and delay the first output signal for a third preset time; and a second logic operation circuit configured to perform a logic operation on an output signal of the inverted signal delaying circuit and the first output signal, and output a signal generated by performing the logic operation in accordance with the reset signal.

The logic operation performed on the output signal of the inverted signal delaying circuit and the first output signal is a NOR operation.

The second logic operation circuit includes a NOR gate.

The flip-flop uses the first output signal as the clock signal, and outputs its input signal at a rising edge of the first output signal.

The noise sense removing circuit further includes a second signal delaying circuit configured to delay the first output signal input to the first logic operation circuit for a fourth preset time and output the delayed first output signal.

The first logic operation circuit is configured to perform a logic operation on an output signal of the second signal delaying circuit and an inverting signal of the output signal of the flip-flop, and invert and output a signal generated by performing the logic operation.

The logic operation performed on the output signal of the second signal delaying circuit and the inverting signal is a NAND operation.

A width of a pulse generated by the notch phenomenon or the glitch phenomenon is smaller than that of the first output signal.

The width of the pulse generated by the notch phenomenon or the glitch phenomenon is smaller than the first preset time of the falling edge signal delaying circuit.

A circuit for removing noise of an input signal according to one example embodiment of the present invention includes a falling edge signal delaying circuit configured to output a first delay output signal generated by delaying a falling edge of a first output signal for a preset time; a falling edge sensing circuit configured to sense the falling edge of the first output signal, and generate a pulse signal in accordance with the sensed falling edge; a flip-flop configured to output the first delay output signal in accordance with an input clock signal; and a first logic operation circuit configured to perform a logic operation on an output signal of the flip-flop and the first output signal delayed for the preset time, thereby generating a second output signal.

As described above, an apparatus of processing a signal in a memory device includes a circuit for removing noise, such as a notch or a glitch, occurring to an input signal. As a result, a clock operating normally may be generated.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in detail with reference to the accompanying drawings.

Figure 1:
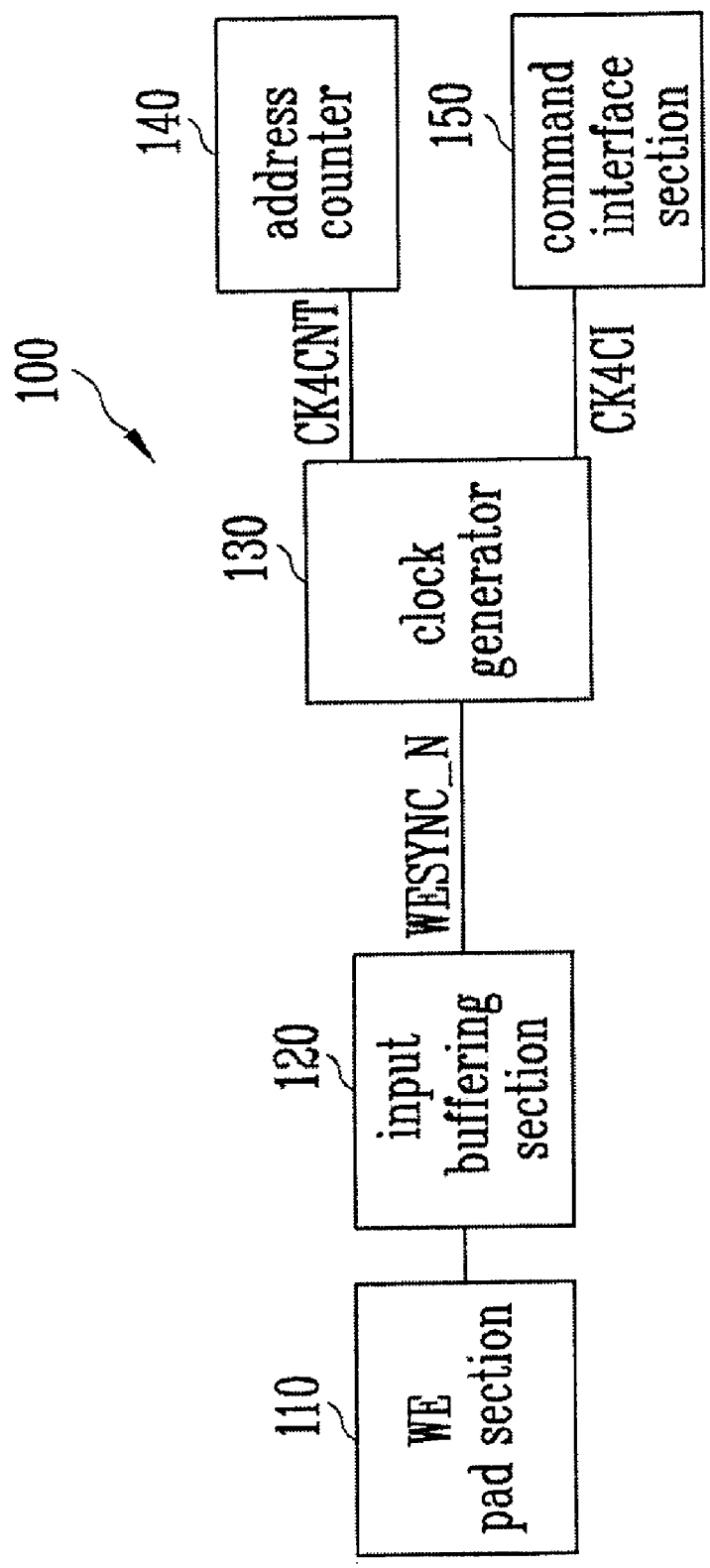
FIG. 1 is a block diagram illustrating a partial data signal input circuit included in a conventional flash memory device.
Figure 2A:
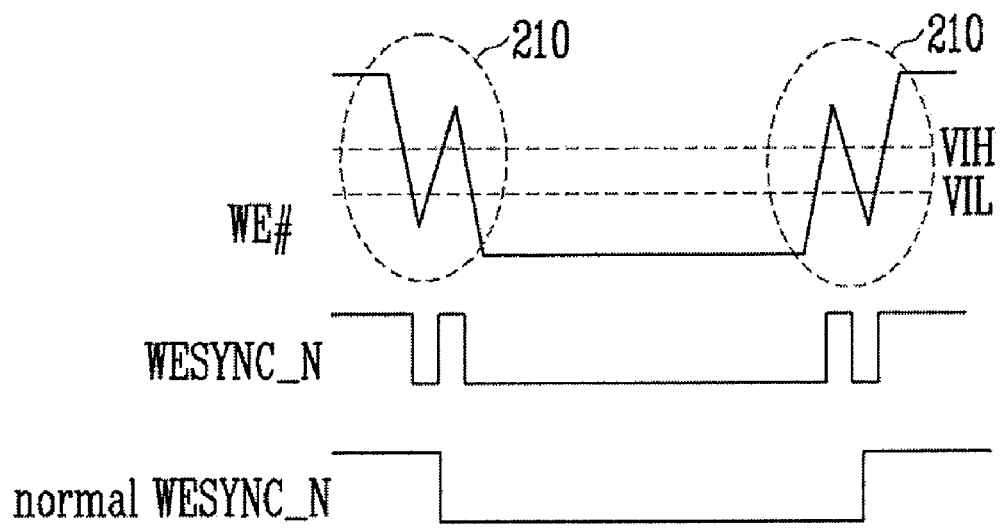
FIG. 2A is a timing diagram illustrating an output signal of the input buffering section when a notch occurs to a signal.
Figure 2B:
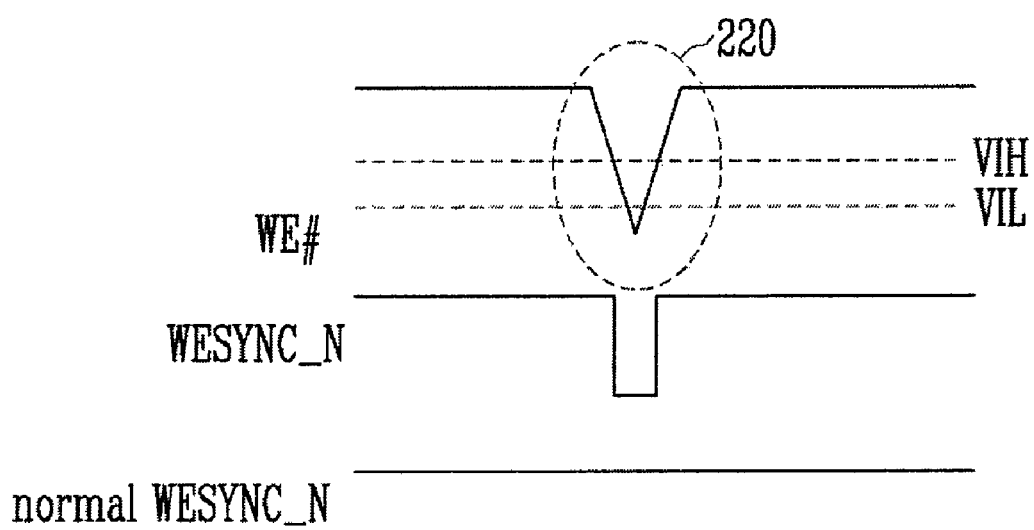
FIG. 2B is a timing diagram illustrating the output signal of the input buffering section when a glitch is occurs to a signal.
Figure 3A:
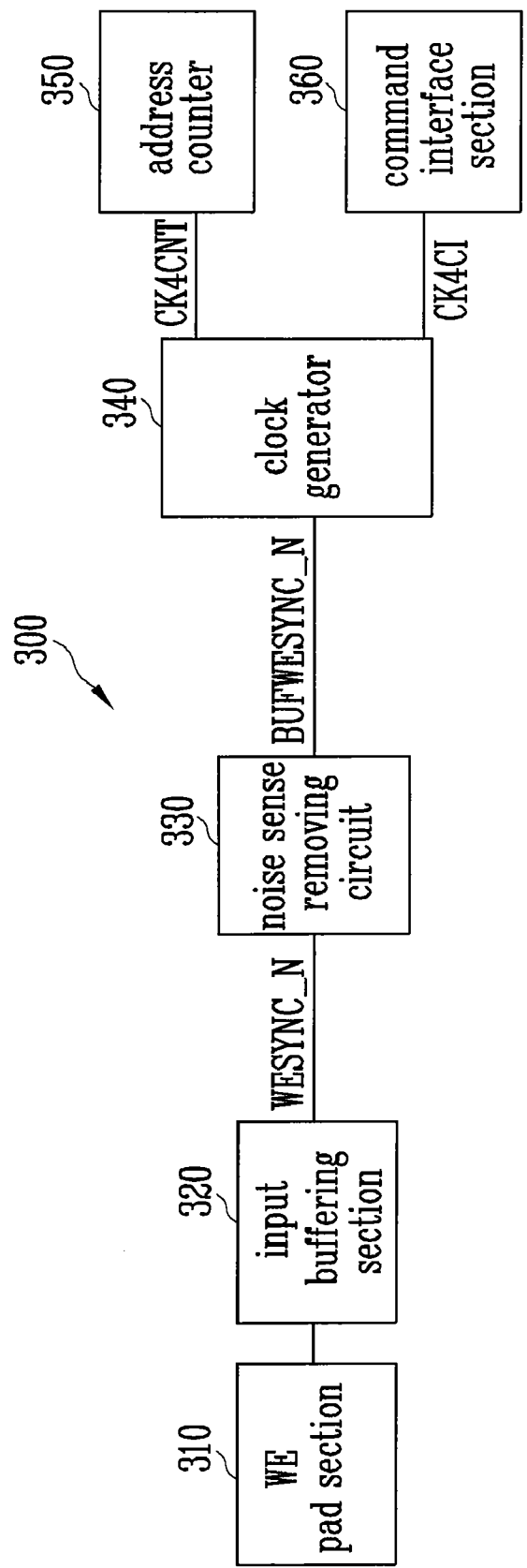
FIG. 3A is a block diagram illustrating a data signal input circuit having a circuit for removing noise in a flash memory device according to one example embodiment of the present invention.

FIG. 3A is a block diagram illustrating a data signal input circuit having a circuit for removing noise in a flash memory device according to one example embodiment of the present invention.

In FIG. 3A, the data signal input circuit 300 includes a WE pad section 310 for receiving a WE signal, an input buffering section 320 for amplifying the WE signal input through the WE pad section 310 to a digital level and outputting the amplified WE signal (i.e., signal WESYNC_N), a noise sense removing circuit 330 for sensing a noise in the signal WESYNC_N and removing the noise, a clock generator 340 for receiving a signal BUFWESYNC_N having the noise removed by the noise sense removing signal 330 and outputting a clock signal using the signal BUFWESYNC_N, an address counter 350 and a command interface section 360 for operating in accordance with the clock signal output from the clock generator 340. The data signal input circuit 300 is one apparatus for processing a signal in the flash memory device.

The WE pad section 310 receives the WE signal from an outside pin of a chip. The input buffering section 320 amplifies the WE signal to a digital level, and outputs the amplified signal, i.e. signal WESYNC_N.

The input buffering circuit 320 outputs the signal WESYNC_N having a high level when the WE signal is increased to a voltage greater than an upper voltage VIH, and outputs the signal WESYNC_N having a low level when the WE signal is decreased to a voltage less than a lower voltage VIL.

The noise sense removing circuit 330 receives the signal WESYNC_N from the input buffering section 320, removes noise when a pulse of the signal WESYNC_N is changed due to the noise, and outputs the signal BUFWESYNC_N in accordance with the removal.

The clock generator 340 outputs an address counter clock signal CK4CNT (clock for count) and a command interface clock signal CK4CI (clock for command interface) in accordance with the output signal BUFWESYNC_N.

The address counter 350 counts an address needed for an operation in accordance with the output address counter clock signal CK4CNT.

The command interface section 360 provides an interface for a command operation in accordance with the output command interface clock signal CK4CI.

In brief, the noise sense removing circuit 330 of the present embodiment removes noise, such as a notch or a glitch, in the signal WESYNC_N, such that the clock generator 340 generates a normal clock signal. Accordingly, the memory device operates normally.

Hereinafter, the noise sense removing circuit 330 will be described in detail.

Figure 3B:
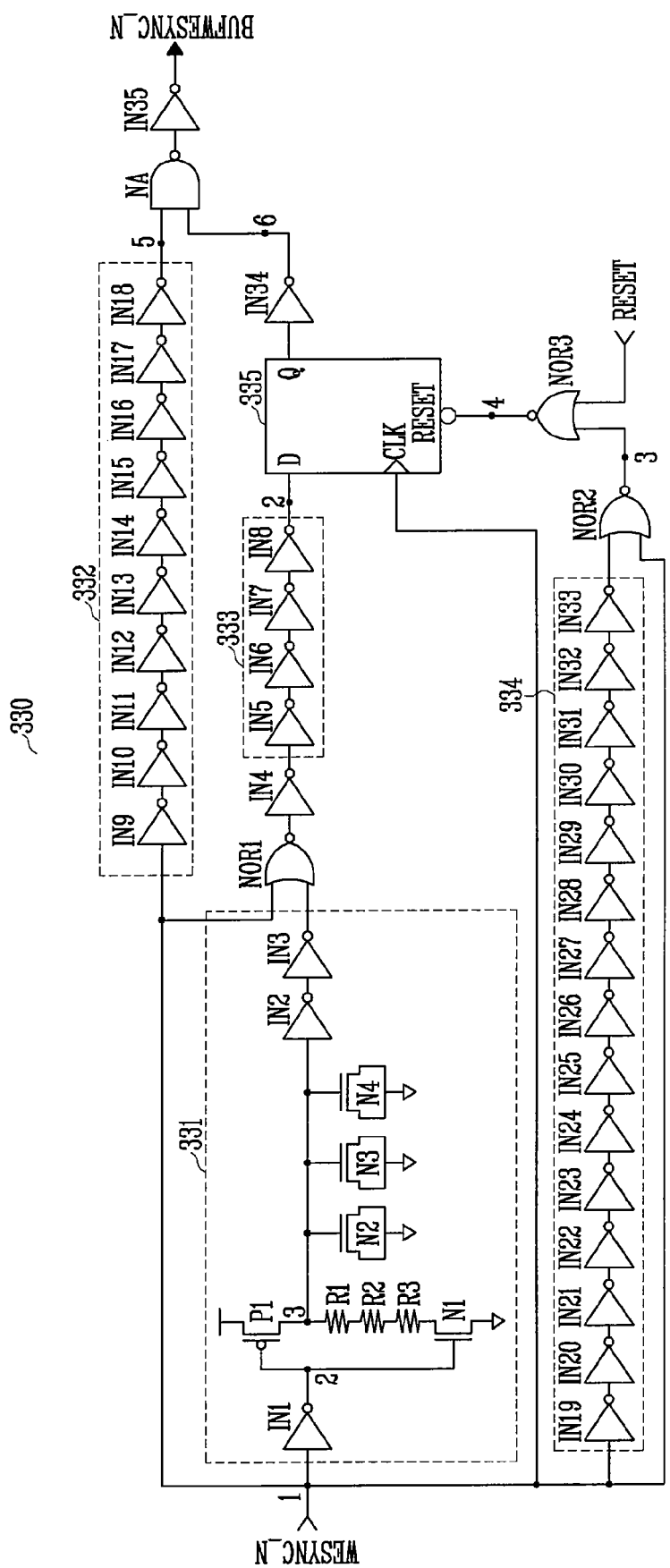
FIG. 3B is a view illustrating circuitry of the noise sense removing circuit of FIG. 3A.

FIG. 3B is a view illustrating circuitry of the noise sense removing circuit of FIG. 3A.

In FIG. 3B, the noise sense removing circuit 330 of the present embodiment receives the signal WESYNC_N from the input buffering section 320, and removes noise in the received signal WESYNC_N. In addition, the noise sense removing circuit 330 includes a first signal delaying circuit 331, a second signal delaying circuit 332, a third signal delaying circuit 333, a signal invert delaying circuit 334, a flip-flop 335, first to third NOR gates NOR1 to NOR3, a NAND gate NA, a fourth inverter IN4, a thirty-fourth inverter IN34 and a thirty-fifth inverter IN35.

The first signal delaying circuit 331 has first to third inverters IN1 to IN3, first to fourth N-MOS transistors N1 to N4, a first P-MOS transistor P1 and first to third resistors R1 to R3.

The second signal delaying circuit 332 includes ninth to eighteenth inverters IN9 to IN18.

The third signal delaying circuit 333 has fifth to eighth inverters IN5 to IN8.

The signal invert delaying circuit 334 includes nineteenth to thirty-third inverters IN19 to IN33.

The first signal delaying circuit 331 receives the signal WESYNC_N through a first node 1, and delays the received signal WESYNC_N for a first predetermined time.

The second signal delaying circuit 332 receives the signal WESYNC_N through a first node 1, and delays the received signal WESYNC_N for a second preset time.

An output signal of the first signal delaying circuit 331 is input to one terminal of the first NOR gate NOR1. Additionally, the signal WESYNC_N output from the input buffering section 320 is input to the other terminal of the first NOR gate NOR1.

The first NOR gate NOR1 performs a NOR operation on the output signal of the first signal delaying circuit 331 and the signal WESYNC_N.

An output of the first NOR gate NOR1 is inverted by the fourth inverter IN4, the inverted output is input to the third signal delaying circuit 333, and then the inverted output is delayed for a third preset time.

An output signal WESYNC_DLY of the third signal delaying circuit 333 is input to a D terminal of the flip-flop 335 through a second node 2.

The flip-flop 335 is configured as a D flip-flop and outputs the signal WESYNC_DLY through an output terminal Q in response to a clock signal CLK. Furthermore, the flip-flop 335 outputs a signal having a low level irrespective of the input output signal WESYNC_DLY when a reset signal RESET is input. The clock signal CLK is the output signal WESYNC_N of the input buffering section 320.

The output signal WESYNC_N of the input buffering section 320 is input to the signal invert delaying circuit 334, and is delayed for a fourth predetermined time. Subsequently, the delayed output signal WESYNC_N is inverted, and then the inverted output signal is input to one terminal of the second NOR gate NOR2. In addition, the output signal WESYNC_N of the input buffering section 320 is input to the other terminal of the second NOR gate NOR2.

An output signal WEFALL_PULSE of the second NOR gate NOR2 is input to one terminal of the third NOR gate NOR3 through a third node 3. Additionally, the reset signal RESET is input to the other terminal of the third NOR gate NOR3.

An output signal RESETZ_PULSE of the third NOR gate NOR3 is inverted through a fourth node 4, and is then input to a reset terminal RESET of the flip-flop 335.

The output of the flip-flop 335 is inverted by the thirty-fourth inverter IN34, and then the inverted output is input to one terminal of the NAND gate NA through a sixth node 6.

An output signal WESYNC_N2 of the second signal delaying circuit 332 is input to the other terminal of the NAND gate NA through a fifth node 5.

An output signal of the NAND gate NA is inverted by the thirty-fifth inverter IN35.

The thirty-fifth inverter IN35 outputs a signal BUFWESYNC_N.

The first signal delaying circuit 331 delays a falling edge of the output signal WESYNC_N of the input buffering section 320.

The signal invert delaying circuit 334 and the second NOR gate NOR2 sense the falling edge of the output signal WESYNC_N, and then output the signal WEFALL_PULSE having short pulse.

The flip-flop 335 is reset by the output signal WEFALL_PULSE to reset the falling edge of the WE signal. As a result, the flip-flop 335 outputs the signal having a low level, and thus the sixth node 6 has a high level. In other words, the signal having a high level is input to the NAND gate NA.

The output of the fourth inverter IN4 is delayed by the third signal delaying circuit 333, and is then input to the flip-flop 335. As a result, setup timing is satisfied.

The second delaying circuit 332 delays the output signal WESYNC_N of the input buffering section 320 so that a timing of the delayed output signal is consistent with that of the signal DET_NOISE of the sixth node 6. The delayed output signal and the signal DET_NOISE of the sixth node 6, which are characterized by consistent timing, are input to the NAND gate NA, thereby preventing a glitch.

Hereinafter, an operation of the noise sense removing circuit 330 of the present invention will be described in detail with reference to the accompanying drawings.

Figure 4:
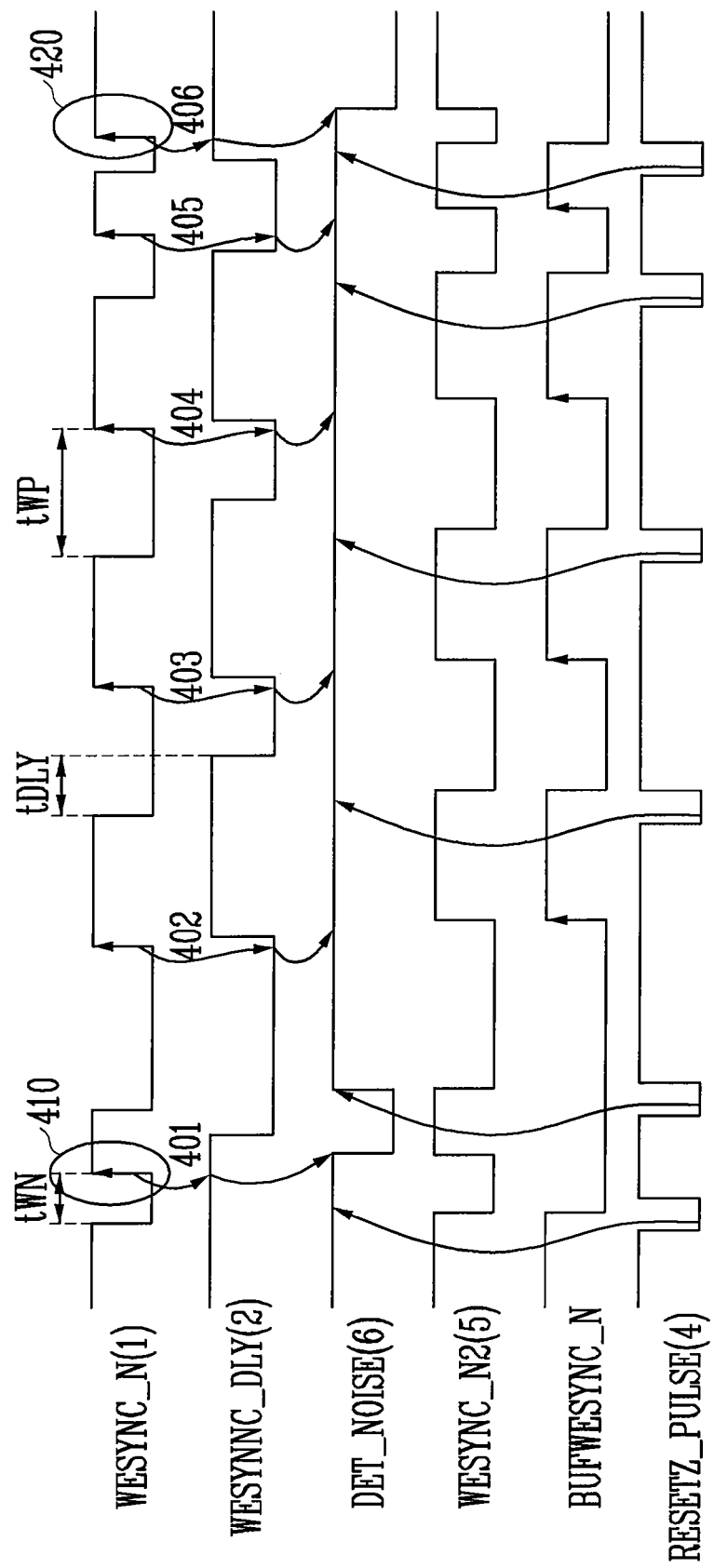
FIG. 4 is a timing diagram illustrating the operation of the noise sense removing circuit according to one example embodiment of the present invention.

FIG. 4 is a timing diagram illustrating the operation of the noise sense removing circuit according to one example embodiment of the present invention.

Referring to FIG. 3B and FIG. 4, when the output signal WESYNC_N of the input buffering section 320 is input to the noise sense removing circuit 330, the WE signal is repeatedly input with a pulse shape. In this case, the flip-flop 335 uses the output signal WESYNC_N of the first node 1 as the clock signal CLK, such that the flip-flop 335 operates at a rising edge.

Accordingly, first to sixth rising edges 401 to 406 of the output signal WESYNC_N of the first node 1 are generated. The first rising edge 401 corresponds to a part 410 where the notch occurs, and the sixth rising edge 406 corresponds to a part 420 where the glitch occurs. Hereinafter, it is assumed that the WE signal has pulse width tWP and the notch has pulse width tWN.

When the signal WESYNC_N of the first node 1 is input to the first signal delaying circuit 331, the first signal delaying circuit 331 delays the falling edge of the input signal WESYNC_N for the first predetermined time, and then outputs the delayed signal.

The output signal of the first signal delaying circuit 331 is input to the third signal delaying circuit 333 through the first NOR gate NOR1 and the fourth inverter IN4, and is then delayed for the third predetermined time by the third signal delaying circuit 333. Subsequently, the third signal delaying circuit 333 outputs the signal WESYNC_DLY to the second node 2.

The output signal WESYNC_DLY of the second node 2 is a signal delayed by time period tDLY. As a result, the falling edge of the signal WESYNC_N is delayed, and is then output. tDLY is smaller than the pulse width tWP of the WE signal, and is larger than the pulse width tWN of the notch. This is because the notch or the glitch has a pulse width that is smaller than the pulse width of the WE signal. In other words, tWN<tDLY<tWP.

The output signal WESYNC_DLY of the second node 2 is input to the D terminal of the flip-flop 335, and is then output in response to the rising edge of the signal WESYNC_N of the first node 1. Subsequently, the output of the flip-flop 335 is input to the sixth node 6 through the thirty-fourth inverter IN34. In this case, the thirty-fourth inverter IN34 outputs the signal DET_NOISE.

The flip-flop 335 outputs the signal input at the rising edge of the signal WESYNC_N of the first node 1, and converts its output to a low level whenever the signal RESETZ_PULSE of the fourth node 4 is input with a low level. As a result, the signal DET_NOISE is output from the sixth node 6, as shown in FIG. 4.

The signal WESYNC_N2 of the fifth node 5 is delayed as much as the second preset time, and is then output. Subsequently, the signal WESYNC_N2 of the fifth node 5 is output as the final output signal BUFWESYNC_N through the NAND gate NA and the thirty-fifth inverter IN35.

The glitch 410 and the notch 420 are removed, and so the final output signal BUFWESYNC_N, which does not have the glitch 410 and the notch 420, is output, as shown in FIG. 4. Accordingly, since the clock generator 340 receives the final output signal BUFWESYNC_N which does not have the glitch 410 and the notch 420, the clock generator 340 generates the address count clock signal CK4CNT and the command interface clock signal CK4CI in accordance with normal operation.

As described above, in the data signal input circuit 300, the glitch 410 and the notch 420 are removed by the noise sense removing circuit 330, and the final output signal BUFWESYNC_N is then input to the clock generator 340. Hereinafter, the output signal of the clock generator 340 generated by using the final output signal BUFWESYNC_N with the glitch 410 and the notch 420 removed will be described in detail with reference to the accompanying drawings.

Figure 5:
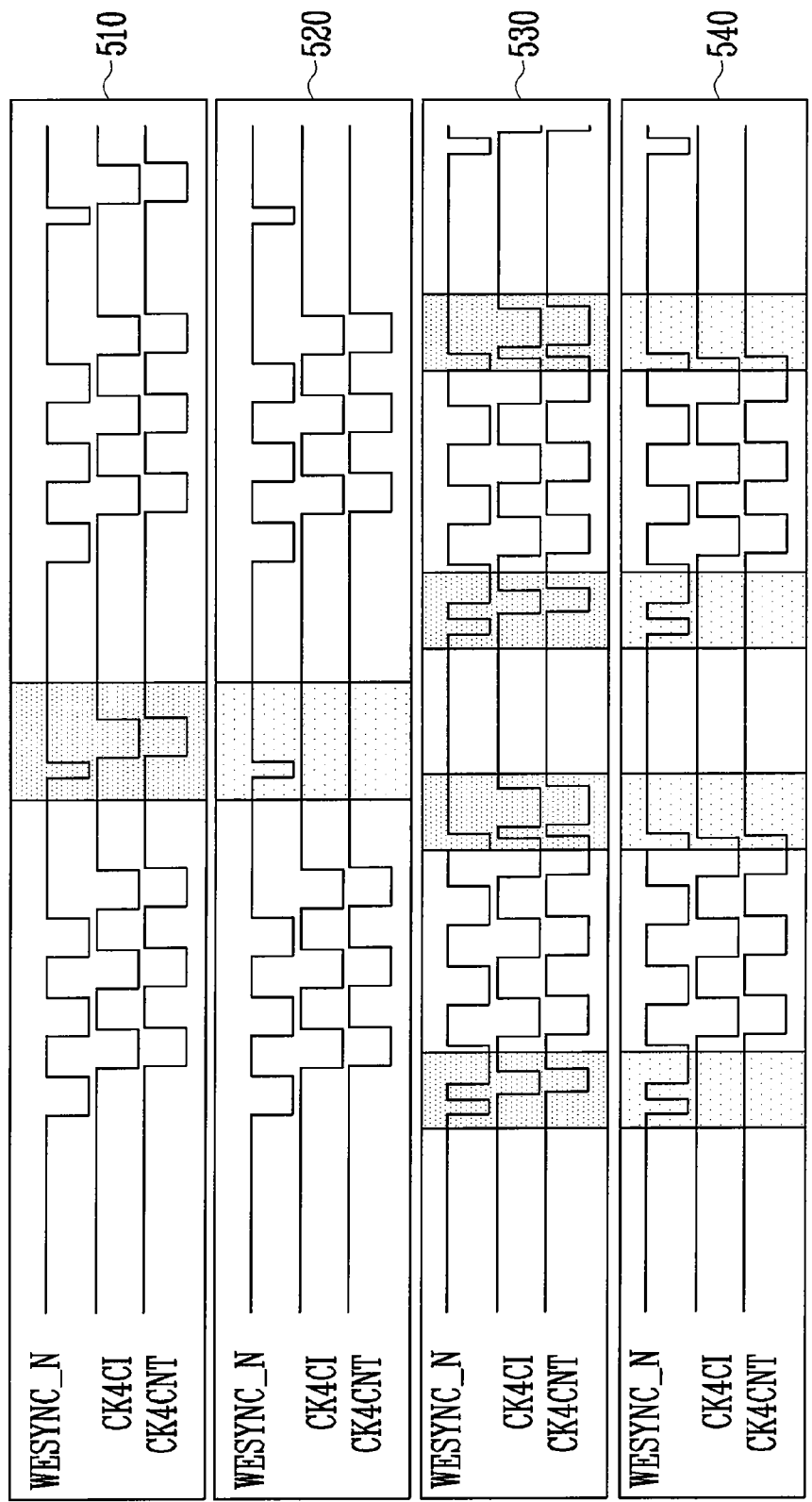
FIG. 5 is a timing diagram illustrating an output signal of a clock generator when noise is removed according to one example embodiment of the present invention.

FIG. 5 is a timing diagram illustrating the output signal of the clock generator when the noise is removed according to one example embodiment of the present invention.

In FIG. 5, a first block 510 shows clock signals CK4C1 and CK4CNT when the glitch occurs and is not removed, and a second block 520 illustrates clock signals CK4C1 and CK4CNT when the glitch occurs but is removed.

Furthermore, a third block 530 shows clock signals CK4C1 and CK4CNT when the notch occurs and is not removed, and a fourth block 540 illustrates clock signals CK4C1 and CK4CNT when the notch occurs but is removed.

As shown in the blocks 510 to 540 of FIG. 5, the clock signals CK4C1 and CK4CNT are normally generated by removing the glitch and the notch through the noise sense removing circuit 330.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus for processing a signal in a memory device, the apparatus comprising:

an input buffering section configured to amplify an input control signal to a digital level, and output a first output signal in accordance with the amplification;

a noise sense removing circuit configured to sense a notch phenomenon or a glitch phenomenon occurring to the first output signal, remove the notch phenomenon or the glitch phenomenon, and output a second output signal in accordance with the removal, wherein the noise sense removing circuit comprises:

a falling edge signal delaying circuit configured to delay a falling edge of the first output signal for a preset time, thereby outputting a first delay output signal;

a falling edge sensing circuit configured to generate a pulse signal by sensing the falling edge of the first output signal;

a flip-flop configured to output the first delay output signal in accordance with the clock signal, and operate using an output signal of the falling edge sensing circuit as a reset signal; and a first logic operation circuit configured to perform a logic operation on an output signal of the flip-flop and the first output signal delayed for the preset time, thereby generating the second output signal; and a clock generator configured to generate a clock signal using the second output signal.

2. The apparatus of claim 1, wherein the falling edge signal delaying circuit includes:

a falling edge delaying circuit configured to delay the falling edge of the first output signal for a first predetermined time; and a first signal delaying circuit configured to delay for a second preset time a signal generated by inverting after performing a logic operation on an output signal of the falling edge delaying circuit and the first output signal, and output the first delay output signal in accordance with the delay.

3. The apparatus of claim 2, wherein the logic operation is a NOR operation.

4. The apparatus of claim 1, wherein the falling edge sensing circuit includes:

an inverted signal delaying circuit configured to invert and delay the first output signal for a third preset time; and a second logic operation circuit configured to perform a logic operation on an output signal of the inverted signal delaying circuit and the first output signal, and output a signal generated by performing the logic operation in accordance with the reset signal.

5. The apparatus of claim 4, wherein the logic operation performed on the output signal of the inverted signal delaying circuit and the first output signal is a NOR operation.

6. The apparatus of claim 4, wherein the second logic operation circuit includes a NOR gate.

7. The apparatus of claim 1, wherein the flip-flop uses the first output signal as the clock signal, and outputs its input signal at a rising edge of the first output signal.

8. The apparatus of claim 1, wherein the noise sense removing circuit further includes:

a second signal delaying circuit configured to delay the first output signal input to the first logic operation circuit for a fourth preset time and output the delayed first output signal.

9. The apparatus of claim 8, wherein the first logic operation circuit is configured to perform a logic operation on an output signal of the second signal delaying circuit and an inverting signal of the output signal of the flip-flop, and invert and output a signal generated by performing the logic operation.

10. The apparatus of claim 9, wherein the logic operation performed on the output signal of the second signal delaying circuit and the inverting signal is a NAND operation.

11. The apparatus of claim 1, wherein a width of a pulse generated by the notch phenomenon or the glitch phenomenon is smaller than that of the first output signal.

12. The apparatus of claim 11, wherein the width of the pulse generated by the notch phenomenon or the glitch phenomenon is smaller than the first preset time of the falling edge signal delaying circuit.

13. A circuit for removing noise of an input signal, the circuit comprising:

a falling edge signal delaying circuit configured to output a first delay output signal generated by delaying a falling edge of a first output signal for a preset time;

a falling edge sensing circuit configured to sense the falling edge of the first output signal, and generate a pulse signal in accordance with the sensed falling edge;

a flip-flop configured to output the first delay output signal in accordance with an input clock signal; and a first logic operation circuit configured to perform a logic operation on an output signal of the flip-flop and the first output signal delayed for the preset time, thereby generating a second output signal.

14. The circuit of claim 13, wherein the falling edge signal delaying circuit includes:

a falling edge delaying circuit configured to delay the falling edge of the first output signal for a first preset time; and a first signal delaying circuit configured to perform a logic operation on an output signal of the falling edge delaying circuit and the first output signal, delay for a second preset time a signal generated by inverting after performing a logic operation, and output the first delay output signal in accordance with the delay.

15. The circuit of claim 14, wherein the logic operation performed on the output signal of the falling edge delaying circuit and the first output signal is a NOR operation.

16. The circuit of claim 13, wherein the falling edge sensing circuit includes:

an inverted signal delaying circuit configured to invert and delay the first output signal for a third preset time; and a second logic operation circuit configured to perform a logic operation on an output signal of the inverted signal delaying circuit and the first output signal, and output a signal generated by performing the logic operation in accordance with the reset signal.

17. The circuit of claim 13, further comprising:

a second signal delaying circuit configured to delay the first output signal input to the first logic operation circuit for a fifth preset time and output the delayed first output signal.

18. The circuit of claim 17, wherein the first logic operation circuit is configured to perform a logic operation on an output signal of the second signal delaying circuit and an inverting signal of the output signal of the flip-flop, and invert and output a signal generated by performing the logic operation.

19. The circuit of claim 13, wherein a width of a pulse generated by the noise is smaller than that of the first output signal.

20. The circuit of claim 13, wherein a width of a pulse generated by the noise is smaller than the first preset time of the falling edge signal delaying circuit.

* * * * *